(12) United States Patent
Blauvelt et al.

(10) Patent No.: US 9,564,734 B2
(45) Date of Patent: Feb. 7, 2017

(54) METHOD OF FABRICATING AND OPERATING AN OPTICAL MODULATOR

(71) Applicant: EMCORE Corporation, Alhambra, CA (US)

(72) Inventors: Henry A. Blauvelt, San Marino, CA (US); Xiaoguang He, Diamond Bar, CA (US); Kerry Vahala, Pasadena, CA (US)

(73) Assignee: EMCORE CORPORATION, Alhambra, CA (US)

( * ) Notice: Subject to any disclaimer, the term of this patent is extended or adjusted under 35 U.S.C. 154(b) by 0 days.

(21) Appl. No.: 15/081,575

(22) Filed: Mar. 25, 2016

(65) Prior Publication Data

US 2016/0204870 A1    Jul. 14, 2016

Related U.S. Application Data

(63) Continuation of application No. 14/086,112, filed on Nov. 21, 2013, now Pat. No. 9,306,672, which is a
(Continued)

(51) Int. Cl.
*H01S 5/00*        (2006.01)
*H01S 5/042*       (2006.01)
(Continued)

(52) U.S. Cl.
CPC .......... *H01S 5/0427* (2013.01); *G02F 1/0121* (2013.01); *G02F 1/025* (2013.01); *H01S 5/026* (2013.01); *H01S 5/0265* (2013.01); *H01S 5/042* (2013.01); *H01S 5/0425* (2013.01); *H01S 5/06251* (2013.01); *H01S 5/1028* (2013.01);
(Continued)

(58) Field of Classification Search
CPC ........ H01S 5/0265; H01S 5/026; H01S 5/042; H01S 5/0425; H01S 5/0427; H01S 5/34306; H01S 5/1028; H01S 5/06251
See application file for complete search history.

(56) References Cited

U.S. PATENT DOCUMENTS 4,573,158 A    2/1986  Utaka et al.
4,905,253 A    2/1990  Chraplyvy et al.
(Continued)

FOREIGN PATENT DOCUMENTS

EP    0 556 974       8/1993
EP    0627798 A1    12/1994
(Continued)

OTHER PUBLICATIONS

Sahara et al; Single contact monolithically integrated DFB laser amplifier; IEEE Photonics Technology Letters, vol. 14, No. 7, pp. 899-901; Jul. 2002; doi: 10.1109/LPT.2002.1012378.
(Continued)

*Primary Examiner* — Kinam Park
(74) *Attorney, Agent, or Firm* — David S. Alavi

(57) ABSTRACT

A method of making an optical modulator by determining the material composition of the quantum well region in the waveguide portion of the modulator so that the modulator is transparent at a gain peak wavelength that is greater than the predetermined wavelength by a predetermined amount, and fabricating the modulator with the determined material composition.

25 Claims, 9 Drawing Sheets

Related U.S. Application Data continuation-in-part of application No. 13/831,334, filed on Mar. 14, 2013, now Pat. No. 9,059,801.

(51) Int. Cl.
  H01S 5/026    (2006.01)
  H01S 5/10     (2006.01)
  H01S 5/343    (2006.01)
  H01S 5/0625   (2006.01)
  G02F 1/01     (2006.01)
  G02F 1/025    (2006.01)
  H04B 10/2575  (2013.01)
  H04B 10/516   (2013.01)

(52) U.S. Cl.
  CPC ..... *H01S 5/34306* (2013.01); *H04B 10/2575* (2013.01); *H04B 10/516* (2013.01); *Y10T 29/49002* (2015.01)

(56) References Cited

U.S. PATENT DOCUMENTS

| | | | |
|---|---|---|---|
| 5,020,153 A | 5/1991 | Choa et al. | |
| 5,119,393 A | 6/1992 | Oka et al. | |
| 5,170,402 A | 12/1992 | Ogita et al. | |
| 5,228,049 A | 7/1993 | Paoli | |
| 5,255,276 A | 10/1993 | Tabuchi et al. | |
| 5,373,385 A | 12/1994 | Darcie et al. | |
| 5,432,123 A | 7/1995 | Dentai et al. | |
| 5,590,145 A | 12/1996 | Nitta | |
| 5,680,411 A | 10/1997 | Ramdane et al. | |
| 5,691,989 A * | 11/1997 | Rakuljic | G02B 5/32 |
| | | | 359/15 |
| 5,699,179 A | 12/1997 | Gopalakrishnan | |
| 5,790,581 A | 8/1998 | Nitta | |
| 5,926,493 A | 7/1999 | O'Brien et al. | |
| 5,960,014 A | 9/1999 | Li et al. | |
| 5,991,323 A | 11/1999 | Adams et al. | |
| 6,031,860 A | 2/2000 | Nitta et al. | |
| 6,167,172 A | 12/2000 | Kunkee et al. | |
| 6,646,775 B2 | 11/2003 | Ishizaka | |
| 6,700,910 B1 | 3/2004 | Aoki et al. | |
| 7,437,029 B2 | 10/2008 | Joyner et al. | |
| 7,573,928 B1 | 8/2009 | Pezeshki | |
| 7,680,169 B2 | 3/2010 | Park et al. | |
| 7,991,291 B2 | 8/2011 | Matsui et al. | |
| 8,569,675 B1 * | 10/2013 | Yap | H04B 10/676 |
| | | | 250/214 A |
| 9,059,801 B1 | 6/2015 | Blauvelt et al. | |
| 9,306,372 B2 | 4/2016 | Blauvelt et al. | |
| 9,306,672 B2 * | 4/2016 | Blauvelt | H01S 5/026 |
| 2002/0097941 A1 | 7/2002 | Forrest et al. | |
| 2002/0131466 A1 | 9/2002 | Salvatore et al. | |
| 2002/0158266 A1 | 10/2002 | Sato et al. | |
| 2003/0063646 A1 | 4/2003 | Yoshida | |
| 2003/0091086 A1 | 5/2003 | Sahara et al. | |
| 2003/0185257 A1 | 10/2003 | Suzuki et al. | |
| 2003/0210723 A1 | 11/2003 | Adams et al. | |
| 2004/0081212 A1 | 4/2004 | Schrodinger | |
| 2004/0218931 A1 | 11/2004 | Frederiksen et al. | |
| 2004/0228384 A1 | 11/2004 | Oh et al. | |
| 2004/0228637 A1 | 11/2004 | Lee et al. | |
| 2005/0013332 A1 | 1/2005 | Kish et al. | |
| 2005/0018732 A1 | 1/2005 | Bond et al. | |
| 2005/0041699 A1 | 2/2005 | White et al. | |
| 2005/0249509 A1 | 11/2005 | Nagarajan et al. | |
| 2006/0045145 A1 | 3/2006 | Arahira | |
| 2006/0120416 A1 | 6/2006 | Hu et al. | |
| 2006/0209911 A1 | 9/2006 | Takabayashi | |
| 2006/0285570 A1 | 12/2006 | Xuan et al. | |
| 2007/0116398 A1 | 5/2007 | Pan et al. | |
| 2007/0134002 A1 | 6/2007 | Arahira | |
| 2008/0025358 A1 | 1/2008 | Arahira | |
| 2008/0138088 A1 | 6/2008 | Welch et al. | |
| 2008/0219315 A1 | 9/2008 | Makino et al. | |
| 2008/0267231 A1 * | 10/2008 | Oktyabrsky | H01S 5/18302 |
| | | | 372/26 |
| 2008/0291952 A1 | 11/2008 | Yamamoto et al. | |
| 2010/0266289 A1 | 10/2010 | Devgan et al. | |
| 2011/0091146 A1 | 4/2011 | Knights et al. | |
| 2011/0134957 A1 | 6/2011 | Su et al. | |
| 2011/0150484 A1 | 6/2011 | Wang | |
| 2012/0002694 A1 | 1/2012 | Bowers et al. | |
| 2012/0099185 A1 * | 4/2012 | Yokoyama | B82Y 20/00 |
| | | | 359/340 |
| 2012/0128375 A1 | 5/2012 | Kimoto et al. | |
| 2012/0163405 A1 | 6/2012 | Su et al. | |
| 2012/0240874 A1 | 9/2012 | Yoo et al. | |
| 2013/0021891 A1 | 1/2013 | Fujita et al. | |
| 2016/0248223 A1 * | 8/2016 | Blauvelt | H01S 5/042 |

FOREIGN PATENT DOCUMENTS

| | | |
|---|---|---|
| EP | 0917260 A1 | 5/1999 |
| JP | 2012-094622 A | 5/2012 |
| WO | WO 02/058251 | 7/2002 |

OTHER PUBLICATIONS

Maywar et al; Effect of chirped gratings on reflective optical bistabiiity in DFB semiconductor laser amplifiers; IEEE Journal of Quantum Electronics, vol. 34, No. 12, pp. 2364-2370; Dec. 1998; doi: 10.1109/3.736108.

Brosson; Semiconductor lasers and integrated devices; EDP Sciences 2002; DOI: 10.1051/bib-sfo:2002059; pp. 1-53.

Thedrez et al; Power and facet phase dependence of chirp for index and gain-coupled DFB lasers; IEEE 16th International Semiconductor Laser Conference, Oct. 4-8, 1998. ISLC 1998 NARA, pp. 175-176; doi: 10.1109/ISLC.1998.734193.

Jabbari et al; XPM Response of Multiple Quantum Well chirped DFB-SOA All Optical Flip-Flop Switching; World Academy of Science, Engineering & Technology 56 2009 pp. 696-700.

Woodward et al; A method for reducing multipath interference noise; IEEE Photonics Technology Letters, vol. 6, No. 3, pp. 450-452; Mar. 1994; doi: 10.1109/68.275515.

U.S. Appl. No. 14/740,241, filed Jun. 15, 2015 in the names of Blauvelt et al.

U.S. Appl. No. 15/090,565, filed Apr. 4, 2016 in the names of Blauvelt et al.

Search Report dated Oct. 5, 2015 in counterpart App No. EP 14020022.

Gerlach et al; Indium Phosphide & Related Materials Conf 2005; May 8, 2005; pp. 554-557; DOI:10.1109/ICIPRM.2005.1517557.

He; IEEE Photonoc Technology Letters; vol. 19 No. 5 p. 1041 (Mar. 1, 20007).

Search Report dated Nov. 30, 2015 in co-owned App No. PCT/US2015/050161.

\* cited by examiner

METHOD OF FABRICATING AND OPERATING AN OPTICAL MODULATOR

BENEFIT CLAIMS TO RELATED APPLICATIONS

This application is a continuation of U.S. non-provisional application Ser. No. 14/086,112 filed Nov. 21, 2013 in the names of Blauvelt et al (now U.S. Pat. No. 9,306,672), which is a continuation-in-part of U.S. non-provisional application Ser. No. 13/831,334 filed Mar. 14, 2013 in the names of Blauvelt et al (now U.S. Pat. No. 9,059,801). Both of said applications are incorporated by reference as if fully set forth herein.

BACKGROUND

Field of the Invention

This invention relates to an optical transmission system for analog or digital radiofrequency (RF) signals using an externally modulated solid-state laser, and in particular to an optical modulator coupled to such laser.

Description of the Related Art

An optical telecommunication system transmits information from one place to another by way of an optical carrier whose frequency typically is in the visible or near-infrared region of the electromagnetic spectrum. A carrier with such a high frequency is sometimes referred to as an optical signal, an optical carrier, light beam, or a lightwave signal. The optical telecommunication system includes several optical fibers and each optical fiber includes multiple channels. A channel is a specified frequency band of an electromagnetic signal, and is sometimes referred to as a wavelength. The purpose for using multiple channels in the same optical fiber (called dense wavelength division multiplexing (DWDM)) is to take advantage of the high capacity (i.e., bandwidth) offered by optical fibers. Essentially, each channel has its own wavelength, and all wavelengths are separated enough to prevent overlap. International Telecommunications Union (ITU) standards currently determines the channel separations.

One link of an optical telecommunication system typically has a transmitter, the optical fiber, and a receiver. The optical transmitter has a laser, which converts an electrical signal into the optical signal and launches it into the optical fiber. The optical fiber transports the optical signal to the receiver. The receiver converts the optical signal back into an electrical signal.

Optical transmitters for the transmission of analog or digital radio-frequency (RF) signals over an optical fiber may use either a directly modulated laser or a continuous wave (CW) laser coupled to an external modulator.

Directly modulating the analog intensity of a light-emitting diode (LED) or semiconductor laser with an electrical signal is considered among the simplest methods known in the art for transmitting analog signals, such as voice and video signals, over optical fibers. Although such analog transmission techniques have the advantage of substantially smaller bandwidth requirements than digital transmission, such as digital pulse code modulation, or analog or pulse frequency modulation, the use of amplitude modulation typically places more stringent requirements on the noise and distortion characteristics of the transmitter. A limiting factor in such links can be the second order distortion due to the combination of optical frequency modulation, or chirp, and fiber dispersion.

For these reasons, direct modulation techniques have typically been used in connection with 1310 nm lasers where the application is to short transmission links that employ fiber optic links with low dispersion. It is also possible to use direct modulation of 1550 nm lasers, but in this case the distortion produced by chirp and dispersion must be cancelled using a predistorter that is set for the specific fiber length. In some case, such as when the signal must be sent to more than one location or through redundant fiber links of different length, such a programmable predistorter can be undesirable.

To avoid the distortion problems related to chirp and dispersion at 1550 nm with direct modulation, low chirp external optical modulators are commonly used in analog fiber optic communication systems, such as CATV signal distribution, to amplitude modulate an optical carrier with an information or content-containing signal, such as audio, video, or data signals.

There are two general types of external optical modulators implemented as semiconductor devices known in the prior art: Mach Zehnder modulators and electro-absorption modulators. A Mach-Zehnder modulator splits the optical beam into two arms or paths on the semiconductor device, one arm of which incorporates a phase modulator. The beams are then recombined which results in interference of the two wavefronts, thereby amplitude modulating the resulting light beam as a function of the modulated bias signal applied to the phase modulated arm. An electro-absorption modulator is implemented as a waveguide in a semiconductor device in which the absorption spectrum in the waveguide is modulated by an applied electric bias field, which changes the band gap energy in that region of the semiconductor, thereby modulating the amplitude or intensity of the light beam traversing the waveguide.

SUMMARY OF THE INVENTION

Objects of the Disclosure

It is an object of the present invention to provide an improved optical transmission system using an externally modulated laser.

It is another object of the present invention to provide an electro-optical modulator for use in an externally modulated 1550 nm optical transmission system with high power and good linearity using a modulated semiconductor saturable absorber.

It is still another object of the present invention to provide a highly linear optical transmission system suitable for long haul dispersive optical fiber media using an externally modulated laser with a predetermined bias, and an optical modulator with a lower electrical bias.

It is still another object of the present invention to provide an optical modulator having a waveguide region operated in a positive voltage, negative current characteristic region suitable for use in an analog optical transmission system using long haul dispersive optical fiber media.

It is also an object of the present invention to provide a method for biasing a semiconductor waveguide region in an electro-optical modulator in a broadband analog optical transmission system so that carriers are excited into a conduction band and are extracted from the semiconductor by an electrical field.

It is also an object of the present invention to provide a method for fabricating an optical modulator by estimating the gain peak wavelength of the semiconductor material, and fabricating the modulator with a material composition of the quantum well region so that the modulator has an operating wavelength below that of the gain peak wavelength of the semiconductor material.

It is also an object of the present invention to provide a method for fabricating an optical modulator by determining the material composition of the quantum well region so that the modulator is transparent at a gain peak wavelength that is greater than the predetermined wavelength by a predetermined amount.

It is also an object of the present invention to provide a method for fabricating an optical modulator by using an electroluminescence measurement to determine the material composition of the quantum well region prior to fabrication of the grating of the laser.

It is also an object of the present invention to provide a method for fabricating an integrated laser and optical modulator fabricating of the grating of the laser so that the gain peak wavelength associated with the modulator portion of the structure is at least 10 nm less than the wavelength of the light beam from the laser.

Some implementations or embodiments may achieve fewer than all of the foregoing objects.

Features of the Invention

Briefly, and in general terms, the present disclosure provides a method of operating an optical modulator including a semiconductor device having an optical input for receiving a continuous wave coherent light beam having a predetermined power, a waveguide for transferring the light beam, an electrode connected to a radio frequency signal input and a bias potential for creating an electric field in the waveguide and optically modulating the light beam as the beam traverses the waveguide, and an optical output connected to the waveguide for transferring the modulated optical signal, including applying a continuous wave (cw) coherent light beam to the optical input; and applying a bias voltage to the electrode so that the coherent light beam is optically modulated by the signal modulating the absorption characteristic in the semiconductor device so that the waveguide operates in the absorption region at wavelengths less than the gain peak wavelength.

In some embodiments, the modulator generates electrical current from the photovoltaic effect, the current being withdrawn or extracted from the modulator.

In some embodiments, the carrier density along the length of the semiconductor modulator in the direction of the optical beam is modulated, thereby optically modulating the cw optical beam entering the modulator.

In some embodiments, the gain peak wavelength of the optical signal as a function of wavelength is at least 10 nm greater than the wavelength of the cw optical beam.

In some embodiments, the semiconductor device IS operated in the negative current region of the I-V characteristic.

In some embodiments, the gam peak wavelength associated with the modulator is between 20 and 40 nm greater than the wavelength of the light applied to the modulator.

In some embodiments, the bias is in the range of 0.6 to 1.0 volts with the coherent light beam being applied to the optical input.

In some embodiments, the bias is in the range of 0.7 to 0.9 volts with the coherent light beam being applied to the optical input.

In some embodiments, the modulator junction voltage with no net current injection of extraction is in the range of 0.7 to 0.9 volts with the coherent light beam being applied to the optical input.

In some embodiments, the modulator junction voltage with no net current injection of extraction is 0.8 volts with the coherent light beam being applied to the optical input.

In another aspect, the present disclosure provides a method of fabricating an optical modulator including a semiconductor device having an optical input for receiving a continuous wave coherent light beam having a predetermined power, a waveguide layer for transferring the light beam, an electrode connected to a radio frequency signal input and a bias potential for creating an electric field in the waveguide and optically modulating the light beam as the beam traverses the waveguide, and an optical output connected to the waveguide for transferring the modulated optical signal, including determining the wavelength of the continuous wave coherent light beam to be applied to the modulator; determining the gain of an optical signal as a function of wavelength for various predetermined compositions of the waveguide layer; and fabricating the waveguide layer with a specific composition so that the gain peak of an optical signal as a function of wavelength is greater than the predetermined wavelength of the continuous wave coherent light beam to be applied to the modulator.

In some embodiments, the gain peak of an optical signal in the waveguide layer is between 20 and 40 nm greater than the wavelength of the continuous wave coherent light beam to be applied to the modulator.

In another aspect, the present disclosure provides a method of fabricating a laser transmitter for optical communications including a semiconductor device including (a) a first semiconductor region for producing a coherent light output in response to current injection; and (b) a second semiconductor region disposed adjacent to the first semiconductor region and separated therefrom by a channel, the second semiconductor region having an optical input optically coupled thereto for receiving the coherent light output from the first semiconductor region, and an optical output connected to the second semiconductor region for transferring the modulated optical signal, including forming a laser resonator in the first semiconductor region so as to operate at an optical output wavelength; forming a semiconductor waveguide structure in the second semiconductor region for transferring the coherent light output from the first semiconductor region light beam; forming an optical modulator in the semiconductor waveguide structure, the optical modulator including an active layer including a quantum well region, and an electrode connected to a radio frequency signal input and a bias potential for creating an electric field in the waveguide structure so that the coherent light output is optically modulated as the light beam traverses the waveguide; determining the material composition of the quantum well region so that the modulator is transparent at a gain peak wavelength that is greater than the output wavelength of the laser resonator by a predetermined amount; and fabricating the modulator with said determined material composition.

In some embodiments, the gam peak wavelength associated with the modulator is between 20 and 40 nm greater than the output wavelength of the light applied to the modulator.

In another aspect, the present disclosure provides a method of performing an electroluminescence measurement on the waveguide structure.

In some embodiments, the electroluminescence measurement on the waveguide structure is made prior to fabrication of the laser resonator.

In some embodiments, the optical output wavelength of the laser resonator is determined by a grating in the laser resonator, and the grating is formed so that the gain peak wavelength associated with the laser resonator is between 20 and 40 nm less than the gain peak wavelength at which the modulator region is transparent.

In another aspect, the present disclosure provides an electro-optical arrangement comprising a semiconductor device including: (a) a first semiconductor region including a laser resonator operable to produce a coherent light output in response to current injection; and (b) a second semiconductor region disposed adjacent to the first semiconductor region and separated therefrom by a channel, the second semiconductor region having the same composition as the first semiconductor region, and including an optical input optically coupled to the first semiconductor region for receiving the coherent light output from the first semiconductor region, the second semiconductor device being electrically biased at a lower second bias potential than the first semiconductor device and electrically coupled to an radio frequency information containing signal source, so that current is generated in the second semiconductor device and extracted therefrom, while the coherent light beam is optically modulated by the signal.

In some embodiments, the first bias potential is a positive bias, and the second bias is in the range of 0.7 to 0.9 volts with the coherent light output being applied to the optical input.

In some embodiments, the semiconductor region comprises an InP semiconductor waveguide structure.

In some embodiments, the first semiconductor region comprises an InP semiconductor gain structure having a mirrored first end region and a second end region disposed adjacent to the modulator.

In some embodiments, the semiconductor device includes a first electrode disposed over the InP semiconductor gain structure, and a second electrode disposed over the InP semiconductor waveguide structure.

In some embodiments, the bias applied to the second electrode is zero.

In some embodiments, the bias applied to the second electrode is plus or minus 0.1 volts from the value of the voltage that would have occurred if the modulator is pumped by the source laser, and no current is injected or extracted from the electrode coupled to the modulator.

In another aspect, the present disclosure provides a method of fabricating an optical modulator including a semiconductor device having an optical input for receiving a continuous wave coherent light beam having a predetermined power, a waveguide in the semiconductor device for transferring the light beam, an electrode disposed on the semiconductor device and connected to a radio frequency signal input and a bias potential for creating an electric field in the waveguide and optically modulating the light beam as the beam traverses the waveguide, and an optical output in the semiconductor device connected to the waveguide for transferring the modulated optical signal, comprising the steps of specifying the wavelength of the continuous wave coherent light beam to be applied to the modulator; determining the gain of an optical signal in the waveguide as a function of wavelength for various predetermined compositions of the waveguide and fabricating the waveguide with a specific composition so that the gain peak of an optical signal as a function of wavelength is greater by more than 10 nm than the specified wavelength of the continuous wave coherent light beam to be applied to the modulator.

In another aspect, the present disclosure provides a method of fabricating an optical modulator including a semiconductor device having an optical input for receiving a continuous wave coherent light beam having a predetermined power, a waveguide in the semiconductor device for transferring the light beam, an electrode disposed on the semiconductor device and connected to a radio frequency signal input and a bias potential for creating an electric field in the waveguide and optically modulating the light beam as the beam traverses the waveguide, and an optical output in the semiconductor device connected to the waveguide for transferring the modulated optical signal, comprising the steps of specifying the wavelength of the continuous wave coherent light beam to be applied to the modulator; making an electroluminescence measurement of the modulator at open circuit conditions for determining the gain of an optical signal in the waveguide as a function of wavelength; fabricating the waveguide with a specific composition so that the gain peak of an optical signal as a function of wavelength is greater by more than 10 nm than the specified wavelength of the continuous wave coherent light beam to be applied to the modulator.

In another aspect, the present disclosure provides a method of fabricating a laser transmitter for optical communications including a semiconductor device including (a) a first semiconductor region for producing a coherent light output in response to current injection; and (b) a second semiconductor region disposed adjacent to the first semiconductor region and separated therefrom by a channel, the second semiconductor region having an optical input optically coupled thereto for receiving the coherent light output from the first semiconductor region, and an optical output connected to the second semiconductor region for transferring the modulated optical signal, comprising providing a predetermined wavelength value at which the transmitter is designed to operate; forming a laser resonator in the first semiconductor region; forming a semiconductor waveguide structure in the second semiconductor region for transferring the coherent light output from the first semiconductor region light beam; forming an optical modulator in the semiconductor waveguide structure, the optical modulator including an active layer including a quantum well region, and an electrode connected to a radio frequency signal input and a bias potential for creating an electric field in the waveguide structure so that the coherent light output is optically modulated as the light beam traverses the waveguide; and making an electroluminescence measurement of the modulator at open circuit conditions for determining the gain of an optical signal in the waveguide as a function of wavelength; determining the material composition of the quantum well region so that the modulator is optically transparent to the coherent light output at a gain peak wavelength that is greater than the predetermined wavelength by a predetermined amount, and fabricating the modulator with said determined material composition.

In some embodiments, the predetermined amount of the difference in wavelength is greater than 10 nm but less than 50 nm.

In another aspect, the present disclosure provides an electro-optical arrangement comprising a semiconductor device including: (a) a first semiconductor region including a laser resonator operable to produce a continuous wave coherent light output in response to current injection at a specified wavelength; and (b) a second semiconductor region disposed adjacent to the first semiconductor region and separated therefrom by a channel, the second semiconductor region having the same composition as the first semiconductor region, and including an optical input optically coupled to the first semiconductor region for receiving the coherent light output from the first semiconductor region, the second semiconductor device being electrically biased at a lower second bias potential than the first semiconductor device and electrically coupled to an radio frequency information-containing signal source, so that current is generated in the second semiconductor device and extracted therefrom, while the coherent light beam transmitted in the second semiconductor region is optically modulated by the signal so that the gain peak of the optical signal as a function of wavelength is greater by more than 10 nm than the specified wavelength of the continuous wave coherent light beam applied to the modulator.

In another aspect, the present disclosure provides a an optical modulator comprising an information-containing radio frequency signal input; a semiconductor device having an optical input optically for receiving the coherent light beam, and an electrode connected to said radio frequency signal input and having a modulated bias potential so that current is generated in the semiconductor device and extracted therefrom, fabricating the waveguide with a specific composition so that while the coherent light beam is optically modulated by the signal so that the gain peak of the optical signal as a function of wavelength is greater by more than 10 nm than the specified wavelength of the continuous wave coherent light beam applied to the modulator.

In another aspect, the present disclosure provides a method of fabricating an optical modulator comprising an information-containing radio frequency signal input; a semiconductor device having an optical input optically for receiving the coherent light beam, and an electrode connected to said radio frequency signal input and having a modulated bias potential so that current is generated in the semiconductor device and extracted therefrom, while the coherent light beam is optically modulated by the signal so that the gain peak of the optical signal as a function of wavelength is greater by more than 10 nm than the specified wavelength of the continuous wave coherent light beam applied to the modulator.

In another aspect, the present invention provides an electro-optical arrangement comprising a semiconductor device including a first semiconductor region including a laser resonator operable to produce a coherent light output in response to current injection; and a second semiconductor region disposed adjacent to the first semiconductor region and separated therefrom by a channel, the second semiconductor region having an optical input optically coupled thereto for receiving the coherent light output from the first semiconductor region, the second semiconductor device being electrically biased at a lower second bias potential than the first semiconductor device and electrically coupled to an radio frequency information-containing signal source, so that current is generated in the second semiconductor device and extracted therefrom, while the coherent light beam is optically modulated so that the gain peak of the optical signal as a function of wavelength is greater by more than 10 nm than the specified wavelength of the continuous wave coherent light beam applied to the modulator.

In another aspect, the present invention provides a laser transmitter for optical communications comprising a first semiconductor device including a laser resonator operable to produce a coherent light output in response to current injection at a first bias potential; a second semiconductor device disposed adjacent to the first semiconductor device and having an optical input optically coupled thereto for receiving the coherent light output, the second semiconductor device being electrically biased at a lower second bias potential than the first semiconductor device and electrically coupled to an radio frequency information-containing signal source, so that current is generated in the second semiconductor device and extracted therefrom, while the coherent light beam is optically modulated so that the gain peak of the optical signal as a function of wavelength is greater by more than 10 nm than the specified wavelength of the continuous wave coherent light beam applied to the modulator.

In another aspect, the present invention provides a method of fabricating a laser transmitter for optical communications comprising a first semiconductor device including a laser resonator operable to produce a coherent light output in response to current injection at a first bias potential; a second semiconductor device disposed adjacent to the first semiconductor device and having an optical input optically coupled thereto for receiving the coherent light output, the second semiconductor device being electrically biased at a lower second bias potential than the first semiconductor device and electrically coupled to an radio frequency information-containing signal source, so that current is generated in the second semiconductor device, while the coherent light beam is optically modulated so that the gain peak of the optical signal as a function of wavelength is greater by more than 10 nm than the specified wavelength of the continuous wave coherent light beam applied to the modulator.

In another aspect, the present invention provides a method of operating an optical modulator including a semiconductor device having an optical input for receiving a continuous wave coherent light beam having a predetermined power, a waveguide layer for transferring the light beam, an electrode connected to a radio frequency signal input and a bias potential for creating an electric field in the waveguide and optically modulating the light beam as the beam traverses the waveguide, and an optical output connected to the waveguide for transferring the modulated optical signal, comprising: applying a continuous wave coherent light beam to the optical input; and applying a bias voltage to the electrode so that the coherent light beam is optically modulated and the gain peak of the optical signal as a function of wavelength is greater by more than 30 nm than the specified wavelength of the continuous wave coherent light beam applied to the modulator.

In another aspect, the present invention provides a method of making an optical modulator by determining the material composition of the quantum well region in the waveguide portion of the modulator so that the modulator is transparent at a gain peak wavelength that is greater than the predetermined wavelength by a predetermined amount, and fabricating the modulator with the determined material composition.

In some embodiments, the operating wavelength of the modulator is from 1540 to 1550 nm.

In some embodiments, the gain peak of an optical signal as a function of wavelength is greater by more than 20 nm than the specified wavelength of the continuous wave coherent light beam to be applied to the modulator.

In some embodiments, the gain peak of an optical signal as a function of wavelength is 30 nm greater than the specified wavelength of the continuous wave coherent light beam to be applied to the modulator.

In some embodiments, the operating wavelength of the modulator is at least 30 nm below the gain peak wavelength.

In some embodiments, the operating wavelength of the modulator is from 30 to 40 nm below the gain peak wavelength.

In some embodiments, the operating wavelength of the modulator is 40 nm below the gain peak wavelength.

In some embodiments, the laser and the modulator are integrated on a single semiconductor substrate.

In another aspect, the bias potential applied to the laser is less than the bias potential applied to the modulator.

In some embodiments, the external electrical bias potential applied to the modulator is plus or minus 0.1 volts.

In some embodiments, the modulator is optically pumped by the light beam from the laser to a level of 0.8 volts.

In another aspect, in operation the modulator generates electrical current from the photovoltaic effect, which is withdrawn from the modulator.

In another aspect, the carrier density along the length of the semiconductor modulator in the direction of the optical beam is modulated, thereby optically modulating the cw optical beam entering the modulator.

In another aspect, the modulator comprises an InP semiconductor waveguide structure.

In another aspect, the laser comprises an InP semiconductor gain structure having a mirrored first end region and a second end region disposed adjacent to the modulator.

In another aspect, the laser includes a first electrode disposed over the InP semiconductor gain structure.

In another aspect, the modulator includes second electrode disposed over the InP semiconductor waveguide structure.

In another aspect, the laser and the modulator are integrated on a single semiconductor substrate, and a vertical gap extending approximately one micron into the substrate electrically separates the laser and the modulator. The laser and modulator are optically connected by a common optical waveguide.

Additional objects, advantages, and novel features of the present invention will become apparent to those skilled in the art form this disclosure, including the following detailed description as well as by practice of the invention. While the invention is described below with reference to preferred embodiments, it should be understood that the invention is not limited thereto. Those of ordinary skill in the art having access to the teachings herein will recognize additional applications, modifications and embodiments in other fields, which are within the scope of the invention as disclosed and claimed herein and with respect to which the invention could be of utility.

BRIEF DESCRIPTION OF THE DRAWINGS

These and other features and advantages of this invention will be better understood and more fully appreciated by reference to the following detailed description when considered in conjunction with the accompanying drawings, wherein.

Figure 1:
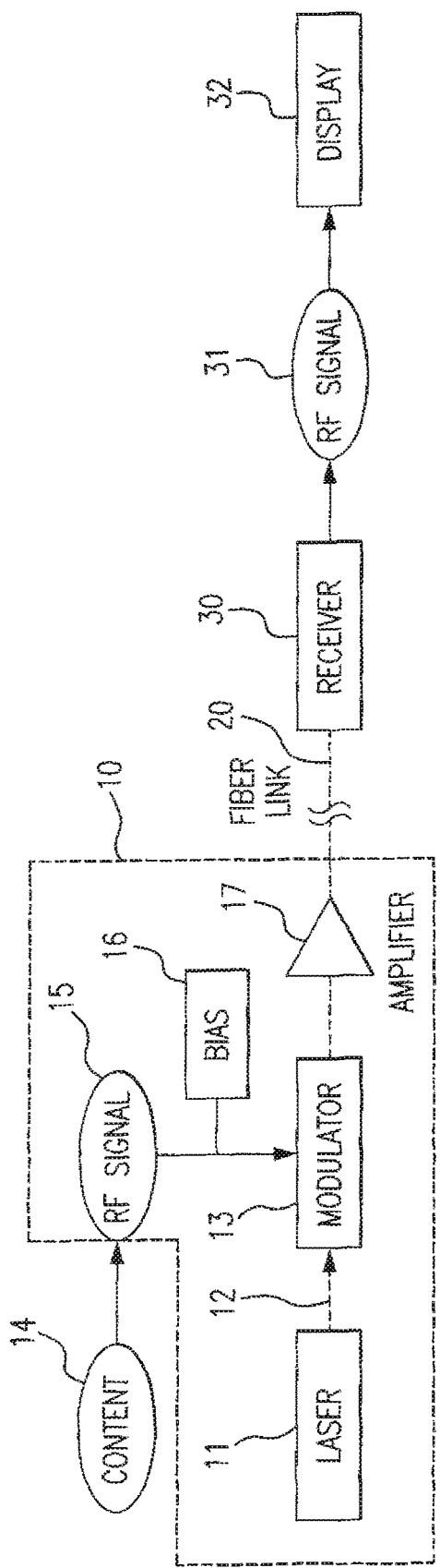
FIG. 1 is an example of an externally modulated optical transmission system known in the prior art.

Additional objects, advantages, and novel features of the present invention will become apparent to those skilled in the art from this disclosure, including the following detailed description as well as by practice of the invention. While the invention is described below with reference to preferred embodiments, it should be understood that the invention is not limited thereto. Those of ordinary skill in the art having access to the teachings herein will recognize additional applications, modifications and embodiments in other fields, which are within the scope of the invention as disclosed and claimed herein and with respect to which the invention could be of utility.

DETAILED DESCRIPTION OF THE PREFERRED EMBODIMENT

Details of the present invention will now be described including exemplary aspects and embodiments thereof. Referring to the drawings and the following description, like reference numbers are used to identify like or functionally similar elements, and are intended to illustrate major features of exemplary embodiments in a highly simplified diagrammatic manner. Moreover, the drawings are not intended to depict every feature of the actual embodiment nor the relative dimensions of the depicted elements, and are not drawn to scale.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

FIG. 1 is block diagram of a prior art optical transmission system in which information or "content" such as audio, video, data files, data bases, or other data is transmitted by an optical transmitter over an optical fiber link to a remote receiver, where the information content is reproduced, displayed, performed, executed or is otherwise utilized. The optical transmitter may be such as represented in U.S. Pat. No. 5,699,179 utilizing an external modulator. The transmitter, shown generally at 10, transmits an optical signal to a remote receiver 30 over an optical fiber path 20. The transmitter 10 includes a semiconductor laser 11, which produces a continuous wave (CW) output. Typical examples of such lasers are distributed feedback (DFB) lasers or Fabry-Perot lasers that produce an output optical beam at a wavelength of 1,550 nm. The un-modulated optical signal from the laser is coupled to a modulator 13 by optical fiber 12. The modulator 13 may be a single modulator such as a Mach-Zehnder modulator, a cascaded MZ modulator or more than one modulator such as in a feed-forward linearizer.

The information or content-containing signal 14, such as audio, video, or data, is initially converted into a broadband RF signal in a suitable channel or frequency band for transmission, such as an amplitude modulated vestigial sideband (AM-SDB) cable television (CATV) or video signal, or a digital signal such as a quadrature amplitude modulated (QAM) symbols which represents the data in digital format. The broadband RF signal 15 is applied to the modulator 13 via a terminal or electrode on its surface. An electrical bias 16 is also applied to the modulator 13.

The modulated optical signal which carries the video data may, in some embodiments, be coupled to an amplifier 17, which in turn is coupled to the a fiber link 20. The amplifier 17 is typically an erbium doped fiber amplifier (EDFA). The amplified optical signal is transmitted over the fiber optical transmission link 20 to the receiver 30. The optical fiber transmission link 20 may be a long-distance link extending up to 100 km. In this case, line amplifiers such as EDFA 17 may be provided at spaced intervals along in the line in order to boost the signal to desired levels. At the receiver 30, an amplifier (not shown) may also be provided to boost the incoming optical signal. The boosted signal is then applied to a photodetector and demodulated at the receiver 30 to an RF electrical signal 31, which is applied to a terminal or display 32 where the original audio, video or data signal is reproduced at the remote location.

Figure 2:
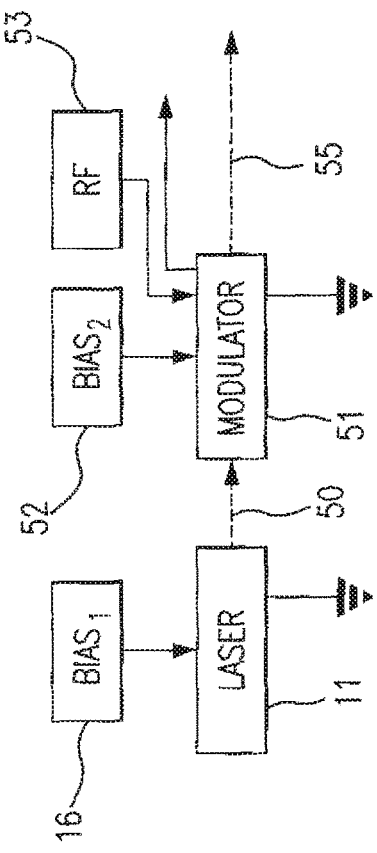
FIG. 2 is a first embodiment of an external modulator coupled to a laser according to the present disclosure.

FIG. 2 is a first embodiment of an optical transmitter including an external modulator coupled to a laser according to the present disclosure. There is depicted a semiconductor laser 11, which produces a continuous wave (CW) output. The laser 11 is operated at an electrical bias which is denoted as Bias (1). The un-modulated optical beam from the laser is coupled to an external modulator 51 by optical fiber 50, or by free space propagation. The modulator 51 is configured as a waveguide with electrodes coupled thereto, and operated at an electrical bias which is denoted as Bias (2), which is less than that Bias (1). In some embodiments, Bias (2) may be 0.8 volts, and Bias (1) may be 1.2 volts. In some embodiments, Bias (2) may be plus or minus 0.1 volts from the value of the voltage that would have occurred if the modulator is pumped by the source laser, and no current is injected or extracted from the electrode coupled to the modulator. In some embodiments, Bias (2) may be in the range of 0.7 to 0.9 volts. In some embodiments, Bias (2) may be in the range of 0.6 to 1.0 volts.

The information-containing RF signal 53 is also applied to the electrode of the modulator 51, so that during modulation the electrical bias applied to the modulator remains less than Bias (1). The electrical bias applied to the modulator 51 determines the amount of the cw light beam from the laser 11 that is absorbed by the modulator 51. In this way, the cw light beam entering the modulator is modified or modulated by the RF signal 53. An optical output is provided for transferring the modulated optical beam to an output fiber 55.

Figure 3:
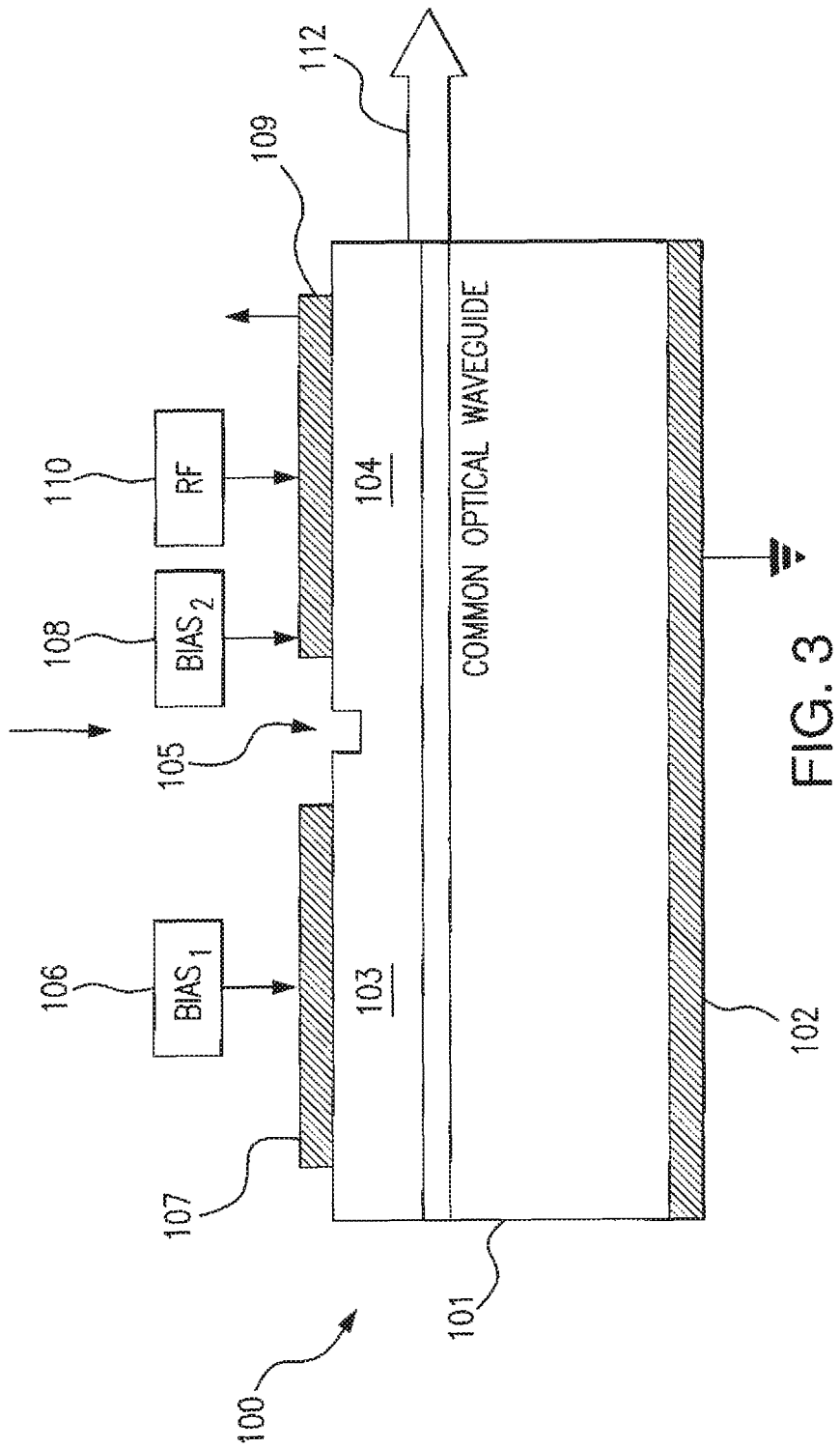
FIG. 3 is a second embodiment of an external modulator coupled to a laser according to the present disclosure.

FIG. 3 is a second embodiment of an external modulator coupled to a laser according to the present disclosure. The design and operation of the device of FIG. 3 is similar to that of FIG. 2, except that the laser and the modulator are implemented on a single integral semiconductor device. More particularly, there is depicted a semiconductor device 100 including a first semiconductor region 103 including a laser resonator 100 operable to produce a coherent light output in response to current injection; and a second semiconductor region 104 disposed adjacent to the first semiconductor region and separated therefrom by a channel 105. The second semiconductor region 104 has an optical input optically coupled thereto for receiving the coherent light output emitted from the first semiconductor region 103 and traversing the channel 105.

The first semiconductor device 103 is electrically biased by an electrode 107 on the top surface, which is connected to an external electrical bias potential 106 to inject current into the region 103. The second semiconductor device includes a waveguide layer for transferring the light beam from the optical input, an electrode 109 connected to a radio frequency signal input 110 and a bias potential 108 for creating an electric field in the waveguide and optically modulating the light beam as the beam traverses the waveguide. The second semiconductor device further includes an optical output 112 connected to the waveguide for transferring the modulated optical signal to an external fiber or other optical component. The bias voltage applied to the electrode 109 is appropriately selected so that the coherent light beam in the waveguide is optically modulated by the applied RF signal by modifying or modulating the absorption characteristic in the semiconductor device while the current generated in the waveguide as a result of photoabsorption of the continuous wave coherent light beam is extracted from the semiconductor device. The RF and DC currents generated are sunk by the RF source and DC bias respectively.

In some embodiments, the laser and the modulator comprise a single chip InP semiconductor device. The laser may comprise an InP semiconductor gain structure region 103 having a mirrored first end region and a second end region disposed adjacent to the modulator. The first electrode 107 is disposed over the InP semiconductor gain structure 103, and the second electrode 109 is disposed over the InP semiconductor waveguide structure 104, and a ground electrode 102 is provided extending over the bottom surface of the entire semiconductor structure.

In the embodiment in which the laser and the modulator are integrated on a single semiconductor substrate, and a vertical gap extending about 1 micron into the substrate electrically separates the laser and the modulator, or the first and second semiconductor regions 103 and 104.

In other embodiments, the laser and the modulator are implemented on two adjacent discrete semiconductor devices, such as depicted in FIG. 2. In some embodiments, an air gap having a width of less than 1 micron may separate the laser and the modulator devices.

The first semiconductor device 103 is electrically biased by an electrode 107 on the top surface, which is connected to an external electrical bias potential 106. The second semiconductor device 104 is electrically biased at a lower second bias potential than the first semiconductor device 103. The specific biasing of the second semiconductor device 104 and the operating current versus voltage characteristics of the device will be described in greater detail with reference to FIG. 4.

Figure 4:
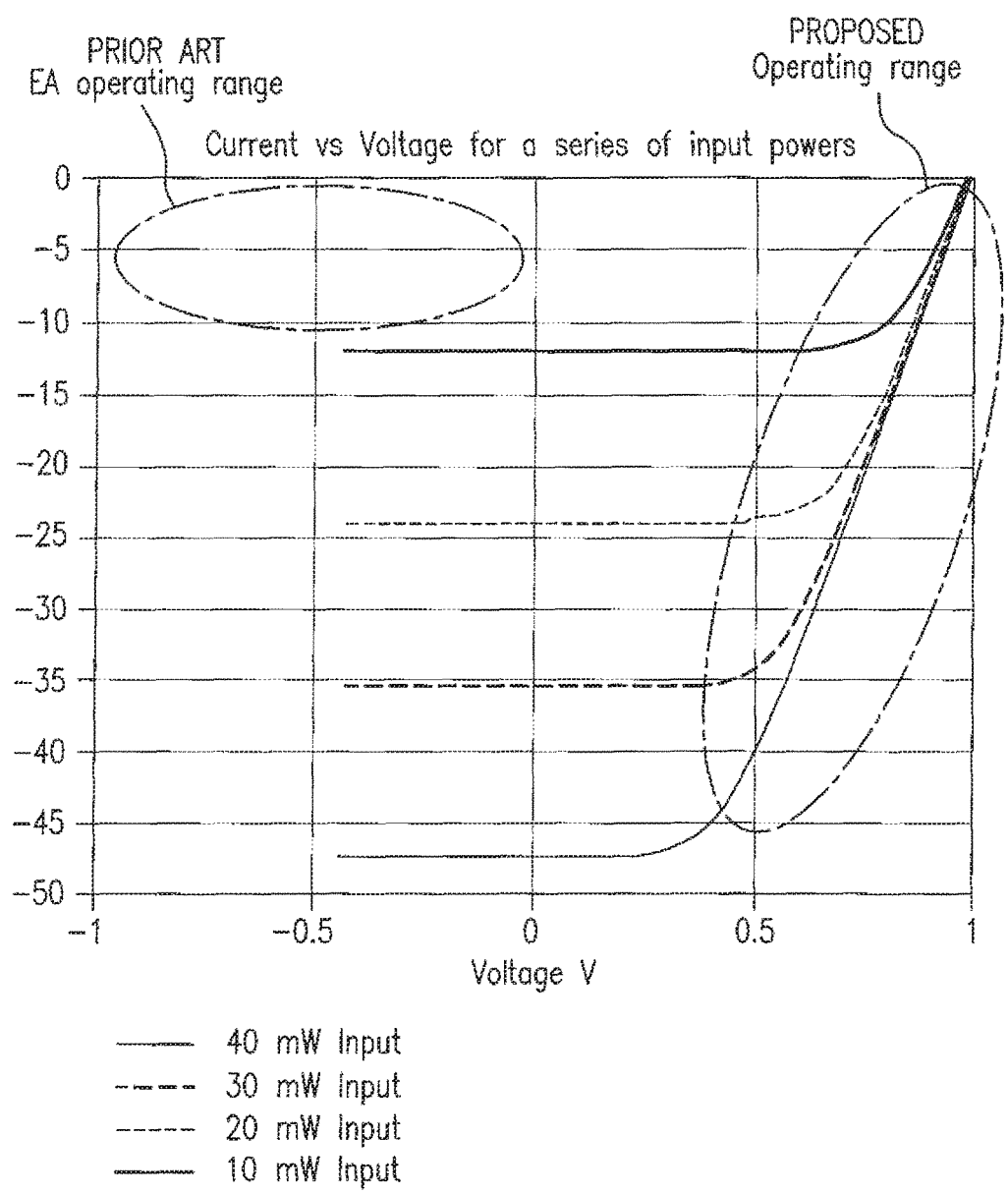
FIG. 4 is a graph of the current versus voltage operating characteristics of an electrooptical modulator for various input powers in the prior art and according to the present disclosure.

FIG. 4 is a graph of the current versus voltage operating characteristics of an electrooptical modulator for various input powers (i.e., 10 mW, 20 mW, 30 mW, and 40 mW) of the cw optical beam in the prior art and according to the present disclosure. In the prior art, in an electro-absorption modulator, the waveguide is biased to operate in a negative voltage, positive current region as shown by the dashed line region marked "PRIOR ART EA OPERATING RANGE". In the modulator according to the present disclosure, the waveguide is biased to operate in a positive voltage, higher negative current region as shown by the dashed line region marked "PROPOSED OPERATING RANGE".

In the absence of any applied bias signal, a small amount of the cw optical beam is absorbed in the modulator and this causes a steady-state carrier density to build up in the modulator. These carriers recombine with a typical lifetime of about one nanosecond. An equilibrium level is reached when the number of carriers generated by optical absorption balances the number lost through recombination. In an embodiment, the absorption is high when the carrier level is low and the absorption is low and when the carrier density is high. When the bias signal is applied, carriers are extracted from the modulator. This lowers the carrier density, and therefore increases absorption of the modulator. In particular, if a current of −10 mA is extracted from the modulator, then the absorption is increased by an amount required to produce that current of −10 mA. Similarly, if a current of −20 mA is extracted from the modulator, then the absorption is increased by an amount required to produce that current of −20 mA. Another way of describing the operation is that carriers in the semiconductor waveguide generated by the cw optical beam are excited into a conduction band and are extracted from the semiconductor region by an applied electrical bias field.

Figure 5:
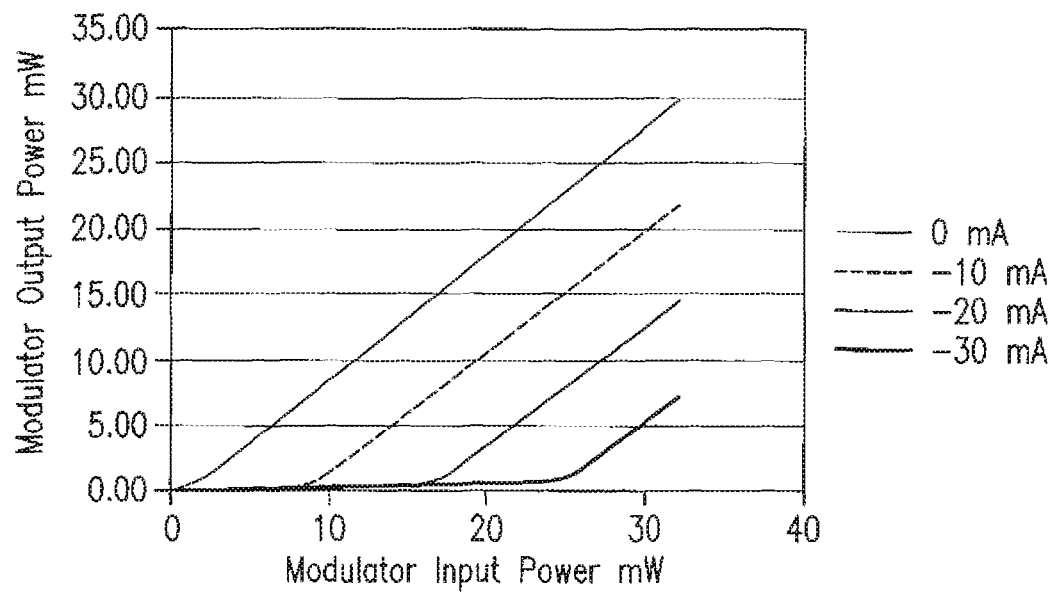
FIG. 5 is a graph depicting the modulator output power versus the modulator input power at various current operation levels according to the present disclosure.

FIG. 5 shows a graph of the output power vs input power for the modulator according to the present disclosure with the parameter being the current extracted from the modulator. Since the proposed modulator has a low RF impedance, it is possible to modulate it in a manner that is close to a current source modulation (at least down to the point that the output power is close to 0). As can be seen from the FIG. 5, this really modulates the saturation power of the device. When operated at a fixed input power of say 30 mW, the net effect is a modulation of the optical output power. The operation is analogous to an optical power subtraction device in which an amount of light corresponding to the extracted current is absorbed from the input cw optical beam. In effect, after the amount of light corresponding to the extracted current is absorbed, that absorption mechanism is saturated.

Figure 6:
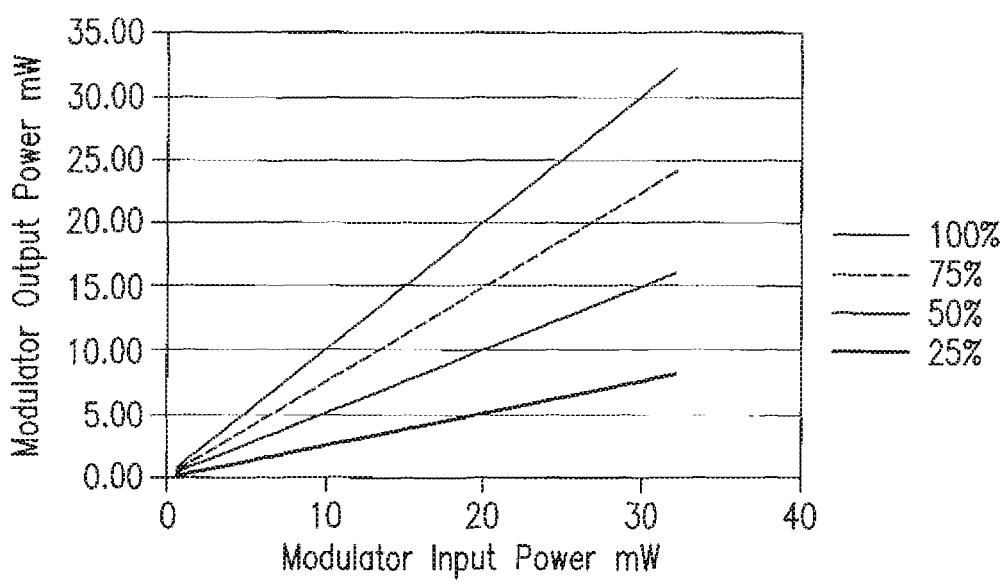
FIG. 6 is a graph depicting the modulator output power versus the modulator input power at various operation levels according to a Mach Zehnder or EA modulator known in the prior art.

The operation of the modulator of FIG. 5 should be contrasted with a traditional modulator where the optical transmission factor is modulated. FIG. 6 shows what happens with a MZ or EA type modulator. The parameter in this FIG. 6 is the transmission through the modulator. For a fixed input power of 30 mW, a modulated output similar to the output of the proposed modulator is produced. However, variation of the output optical power with input optical power with a fixed bias signal is substantially linear, in contrast to the saturation-type variation of the proposed modulator. This reflects the fundamentally different modulation mechanism involved in the proposed modulator.

Figure 7:
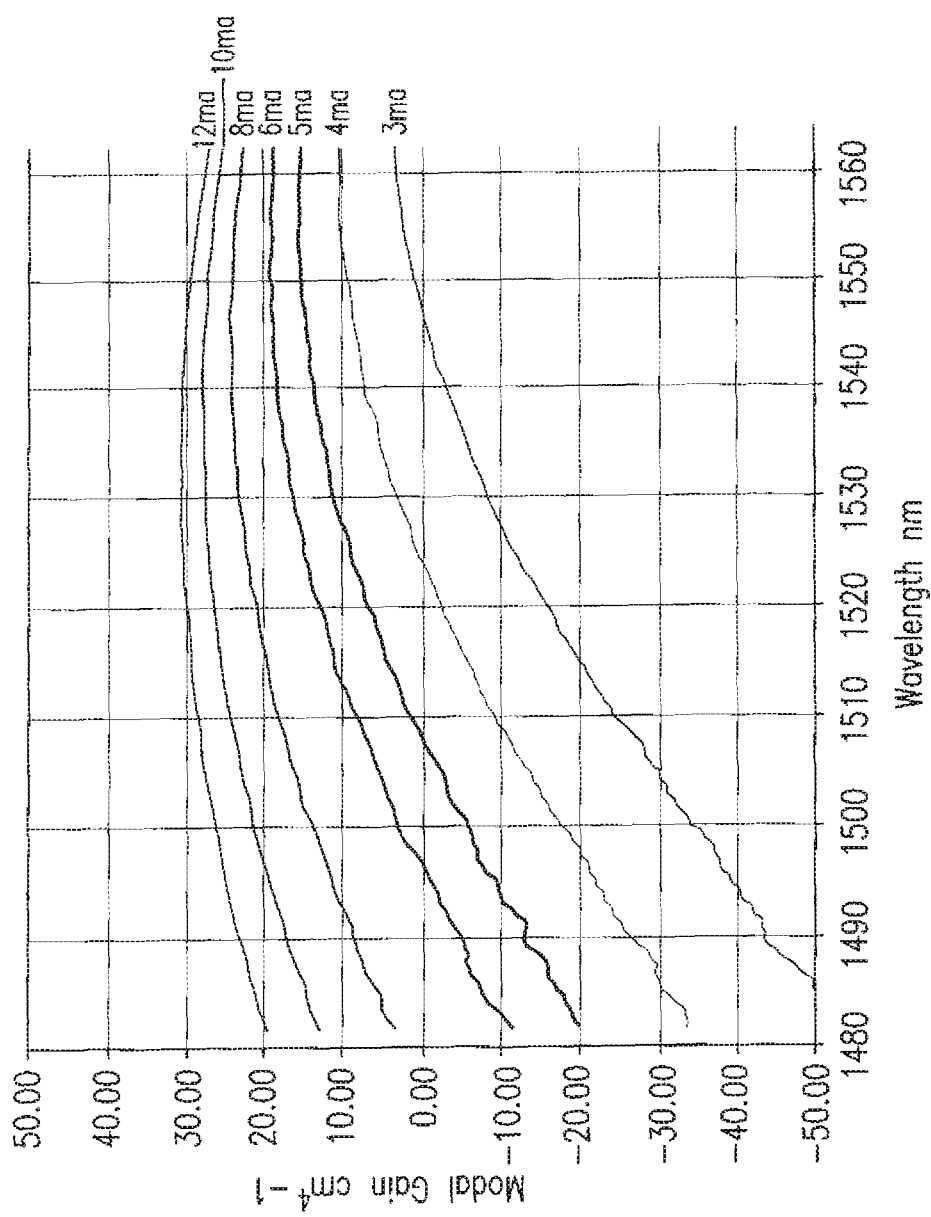
FIG. 7 is a graph depicting the modal gain versus wavelength showing the gain peak wavelength for a given composition of the modulator waveguide.

FIG. 7 is a graph depicting the modal gain versus wavelength showing the gain peak wavelength for a given composition of the modulator waveguide. It is noted that there are different maximum or peak values of the modal gain for different current values through the modulator.

Figure 8:
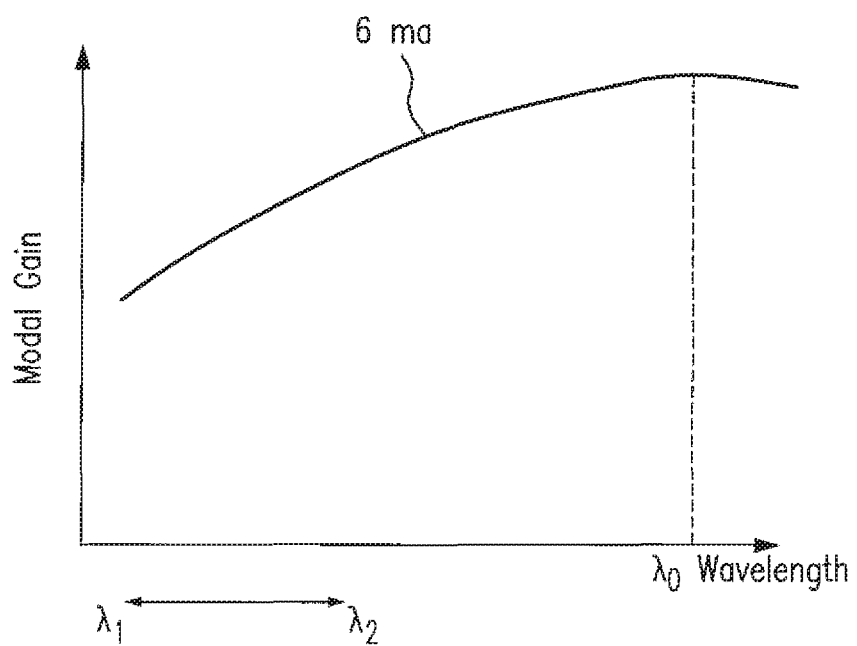
FIG. 8 is a graph depicting the modal gain versus wavelength showing the gain peak wavelength and a range of potential operating wavelengths for the design of a modulator waveguide.

FIG. 8 is a graph depicting the modal gain versus wavelength showing the gain peak wavelength and a range of potential operating wavelengths for the design of a modulator waveguide.

Figure 9:
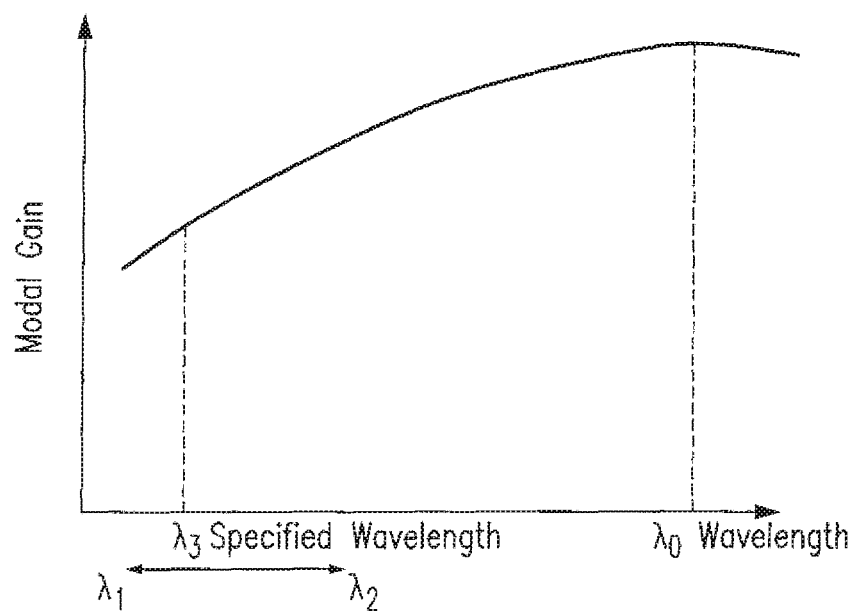
FIG. 9 is a graph depicting the modal gain versus wavelength showing the gain peak wavelength and a selected operating wavelength for a given composition of the modulator waveguide.

FIG. 9 is a graph depicting the modal gain versus wavelength showing the gain peak wavelength and a selected operating wavelength for a given composition of the modulator waveguide.

In the proposed device according to the present disclosure, the material in the modulator section 104 is mostly pumped by the light coming from the source laser 103 that is operating DC. In a test environment, one may evaluate the modulator under the open circuit condition where one is neither injecting nor extracting DC current from the modulator. Under this open circuit condition, the material in the modulator section 104 is pumped to give a carrier density just below the level for which the material becomes optically transparent or has no net absorption or gain. The modulator junction under this condition is at a voltage corresponding to about 0.8 volts forward bias (analogous to the open circuit voltage of a solar cell).

The modulator does not have to be used with the open circuit bias condition. One can either bias the modulator by injecting current, in which case the material will move towards optical gain or extracting current, in which case the absorption increases compared to the open circuit bias condition. The current values in the curves graphed in FIG. 7 are merely intended as nominal or representative to depict typical gain peak wavelengths at different current values, since the depicted data is derived from a prototype test structure that is only electrically pumped, unlike the proposed modulator that would be used in actual practice and which would be mostly optically pumped. Although experimentally one cannot directly measure the optical gain curves for the optically pumped case, the data is suggestive and it is believed that the corresponding curves for the optically pumped case move up and to the left for increasing current, similarly to the curves graphed in FIG. 7 for electrically pumped test structures.

The present disclosure does not specify the signal wavelength relative to the modulator gain curve, since that may depend upon other product design specifications and the customer application environment. However, one aspect of the present disclosure is the fabrication method for the design of an optical modulator and how to specify the wavelength of the material for given operational specifications or requirements. Two methods are reasonable and are embodiments of the present disclosure. One is determining the photoluminescence (PL) peak wavelength. In this case the material is optically pumped and the spectrum of the light emitted from the material is measured by commercially available photoluminescence instruments. This measurement of the photoluminescence (PL) peak wavelength not the same as measurement of the gain curve, but they are related. For example the material used for the gain data presented in FIG. 10 has a PL peak wavelength of 1574 nm. A second method would be to specify the peak of the gain curve under some specific pumping condition. No pumping at all is not a good experimental approach for specifying a gain peak since there isn't any gain peak, the absorption just gets steadily larger as the wavelength is reduced. Pumping the modulator until there is a peak in the gain at some specific level is another way to try to specify this, but it is believed to be less well defined than the PL peak. One embodiment of the present disclosure therefore provides making a PL measurement and using the PL wavelength so determined as a method of characterizing the material. In terms of operation, one would want to have the signal wavelength be below the PL peak, which is different from the design of the semiconductor material in as EA modulator where the signal wavelength in the EA modulator is typically much greater than the peak PL wavelength. One embodiment of the present disclosure therefore provides the selection or specification of the operating wavelength that one is at least 10 nm below the PL peak. In some embodiments, the selection or specification of the operating wavelength is one that is 30 nm below the PL peak.

Figure 10:
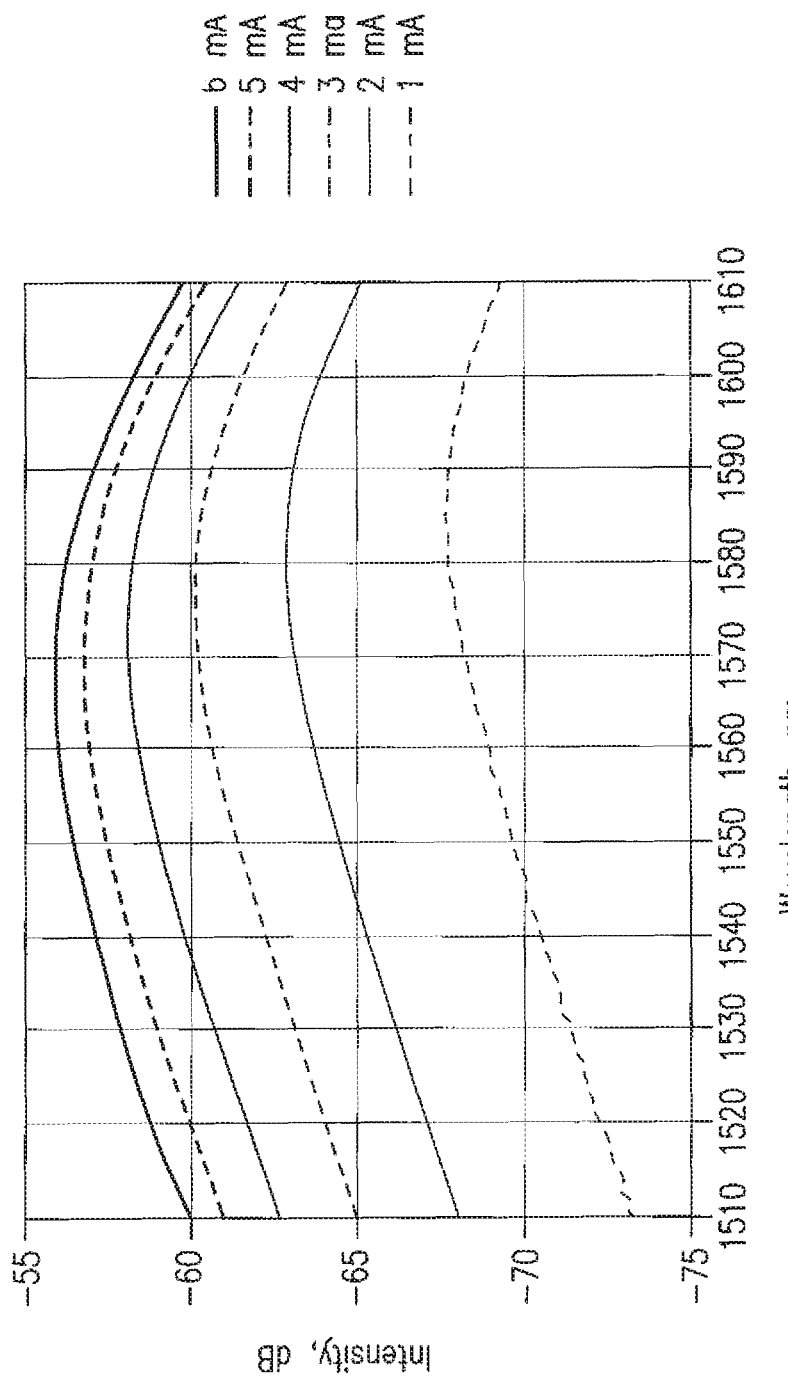
FIG. 10 is a graph depicting the modal gain versus wavelength showing the gain peak wavelength from an electroluminescence measurement of a specimen test modulator at various modulator current values.

FIG. 10 is a graph depicting the modal gain versus wavelength showing the gain peak wavelength from an electro luminescence (EL) measurement of a specimen test modulator at various modulator current values. In one embodiment of the present disclosure, the peak wavelength extrapolated to zero current is an appropriate and precise way to characterize the material. In this case illustrated in FIG. 10, the peak wavelength is about 1589 nm. This is not the same as the PL characterization which was 1574 nm for the same test wafer. In terms of the operating wavelengths that would use with this material, in one embodiment of the present disclosure, suitable wavelengths would be in the range of 1540 to 1550 nm. In another embodiment of the present disclosure, the operating wavelength would be at least 30 nm below the gain peak wavelength. In another embodiment of the present disclosure, the operating wavelength would be in the range of 40 to 30 nm below the gain peak wavelength.

Figure 11:
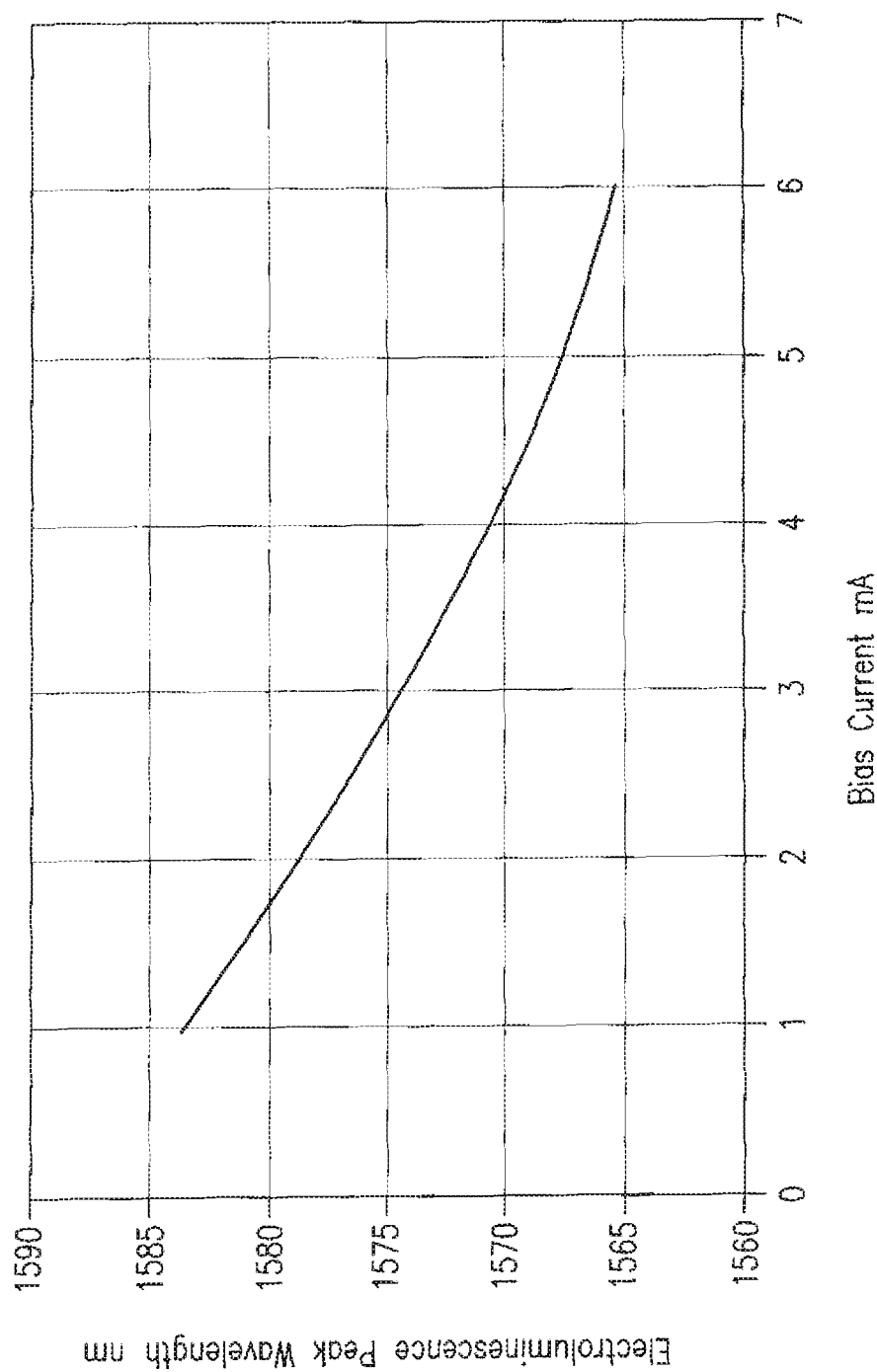
FIG. 11 is a graph depicting the gam peak wavelength versus current from an electroluminescence measurement of a specimen test modulator at various modulator current values.

FIG. 11 is a graph depicting the gam peak wavelength versus current from an electroluminescence measurement of a specimen test modulator at various modulator current values.

Based upon the foregoing characterization of the material, in one embodiment of the present disclosure, the present disclosure provides a method of fabricating a laser transmitter for optical communications including a semiconductor device including (a) a first semiconductor region for producing a coherent light output in response to current injection; and (b) a second semiconductor region disposed adjacent to the first semiconductor region and separated therefrom by a channel, the second semiconductor region having an optical input optically coupled thereto for receiving the coherent light output from the first semiconductor region, and an optical output connected to the second semiconductor region for transferring the modulated optical signal, comprising the steps of providing a predetermined wavelength value at which the transmitter is designed to operate; forming a laser resonator in the first semiconductor region; forming a semiconductor waveguide structure in the second semiconductor region for transferring the coherent light output from the first semiconductor region light beam; forming an optical modulator in the semiconductor waveguide structure, the optical modulator including an active layer including a quantum well region, and an electrode connected to a radio frequency signal input and a bias potential for creating an electric field in the waveguide structure so that the coherent light output is optically modulated as the light beam traverses the waveguide; and determining the material composition of the quantum well region so that the modulator is transparent at a gain peak wavelength that is greater than the predetermined wavelength by a predetermined amount, and fabricating the modulator with said determined material composition.

In another aspect, in one embodiment of the present disclosure, the present disclosure provides a method of fabricating a laser transmitter for optical communications including a semiconductor device including (a) a first semiconductor region for producing a coherent light output in response to current injection; and (b) a second semiconductor region disposed adjacent to the first semiconductor region and separated therefrom by a channel, the second semiconductor region having an optical input optically coupled thereto for receiving the coherent light output from the first semiconductor region, and an optical output connected to the second semiconductor region for transferring the modulated optical signal, comprising the steps of providing a predetermined wavelength value at which the transmitter is designed to operate; forming a laser resonator in the first semiconductor region; forming a semiconductor waveguide structure in the second semiconductor region for transferring the coherent light output from the first semiconductor region light beam; forming an optical modulator in the semiconductor waveguide structure, the optical modulator including an active layer including a quantum well region, and an electrode connected to a radio frequency signal input and a bias potential for creating an electric field in the waveguide structure so that the coherent light output is optically modulated as the light beam traverses the waveguide; and determining the material composition of the quantum well region so that the modulator is transparent at a gain peak wavelength that is greater than the predetermined wavelength by a predetermined amount, and fabricating the modulator with said determined material composition.

Although some specific embodiments of the present invention have been demonstrated in detail with examples, it should be understood by a person skilled in the art that the above examples are only intended to be illustrative but not to limit the scope of the present invention. It should be understood that the above embodiments can be modified without departing from the scope and spirit of the present invention which are to be defined by the attached claims.

What is claimed is:

1. A method for operating an optical modulator that includes a modulator optical waveguide formed on a substrate, the method comprising:

(a) launching an continuous-wave input optical signal to propagate along the modulator optical waveguide, the input optical signal being characterized by an input optical power level and an optical signal wavelength; and (b) applying an electrical modulation signal to a modulator electrode positioned over a semiconductor modulator active region of the modulator optical waveguide so as to modulate an optical transmission level of the input optical signal through the modulator resulting in a modulated output optical signal emitted from the modulator, wherein:

(c) the optical modulator is characterized by a zero-current modulator optical transmission level that is less than 100% and occurs when charge carriers are neither injected into nor extracted from the modulator active region;

(d) an electrical modulation signal level that causes charge carriers to be injected into the modulator active region results in a modulator optical transmission level higher than the zero-current modulator transmission level;

(e) an electrical modulation signal level that causes charge carriers to be extracted from the modulator active region results in a modulator optical transmission level lower than the zero-current modulator transmission level;

(f) the modulator active region is characterized by an estimated optical gain peak wavelength; and (g) the optical signal wavelength is shorter than the estimated optical gain peak wavelength.

2. The method of claim 1 wherein the zero-current modulator optical transmission level is dependent on the input optical power level.

3. The method of claim 1 wherein the optical signal wavelength is more than about 10 nm shorter than the estimated optical gain peak wavelength.

4. The method of claim 1 wherein the optical signal wavelength is between about 20 nm and about 40 nm shorter than the estimated optical gain peak wavelength.

5. The method of claim 1 wherein the estimated optical gain peak wavelength is a peak wavelength of an electroluminescence spectrum of the modulator active region.

6. The method of claim 1 wherein the modulator active region comprises a semiconductor multi-quantum-well structure.

7. The method of claim 1 wherein the electrical modulation signal comprises a sum of a substantially constant modulator bias voltage and an information-carrying RF modulation signal applied to the modulator electrode.

8. The method of claim 7 wherein the input optical power level and the modulator bias voltage, in the absence of the RF modulation signal, result in negligible injection or extraction of charge carriers into or from the active region.

9. The method of claim 7 wherein the modulator bias voltage is within about ±0.1 volts of a voltage that, in the presence of the input optical signal at the input optical power level and in the absence of the RF modulation signal, results in negligible injection or extraction of charge carriers into or from the active region.

10. The method of claim 7 wherein the modulator bias voltage is about 0.8 volts and, in the absence of the RF modulation signal, the modulator input optical power level results in negligible injection or extraction of charge carriers into or from the active region.

11. The method of claim 7 wherein the modulator bias voltage is a positive bias voltage, between about 0.6 V and about 1.0 V, applied to the modulator electrode.

12. The method of claim 7 wherein the modulator bias voltage is a positive bias voltage, between about 0.7 V and about 0.9 V, applied to the modulator electrode.

13. The method of claim 7 wherein applying the modulator bias voltage and the RF modulation signal result in charge carriers being extracted from the modulator active region over a portion of a negative-current region of an I-V characteristic of the modulator active region.

14. The method of claim 1 further comprising generating the continuous-wave input optical signal from a semiconductor laser by applying a substantially constant electrical laser bias voltage to a laser electrode positioned over a semiconductor laser active region of a laser optical waveguide formed on the substrate, wherein the laser and modulator waveguides are arranged so that at least a portion of optical output of the semiconductor laser is launched to propagate as the input optical signal along the modulator optical waveguide.

15. The method of claim 14 wherein the laser optical waveguide includes a grating region having a grating period that results in the optical signal wavelength being shorter than the estimated optical gain peak wavelength.

16. The method of claim 14 wherein the laser optical waveguide includes a grating region having a grating period that results in the optical signal wavelength being more than about 10 nm shorter than a peak wavelength of an electroluminescence spectrum of the modulator active region.

17. The method of claim 14 wherein the laser optical waveguide includes a grating region having a grating period that results in the optical signal wavelength being between about 20 nm and about 40 nm shorter than a peak wavelength of an electroluminescence spectrum of the modulator active region.

18. The method of claim 14 wherein the laser and modulator electrodes are electrically separated by a vertical gap formed in semiconductor material between the electrodes.

19. The method of claim 14 wherein the laser and modulator optical waveguides are distinct portions of a common optical waveguide formed on the substrate.

20. The method of claim 14 wherein the laser bias voltage is greater than the modulator bias voltage.

21. The method of claim 14 wherein the semiconductor laser includes InP.

22. The method of claim 14 wherein the laser optical waveguide includes a reflective first end region and a second end region adjacent the modulator optical waveguide.

23. The method of claim 14 wherein the optical signal wavelength is between about 1540 nm and about 1550 nm.

24. The method of claim 1 wherein the optical modulator includes InP.

25. The method of claim 1 wherein the optical signal wavelength is between about 1540 nm and about 1550 nm.

* * * * *